US012598745B2

(12) United States Patent
Chuang et al.

(10) Patent No.: US 12,598,745 B2
(45) Date of Patent: Apr. 7, 2026

(54) DOUBLE PATTERNING METHOD OF MANUFACTURING SELECT GATES AND WORD LINES

(71) Applicant: Powerchip Semiconductor Manufacturing Corporation, Hsinchu (TW)

(72) Inventors: Yi-Yeh Chuang, Changhua County (TW); Zih-Song Wang, Nantou County (TW); Li-Ta Chen, New Taipei City (TW); Shun-Yu Gao, Hsinchu City (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 531 days.

(21) Appl. No.: 18/139,347

(22) Filed: Apr. 25, 2023

(65) Prior Publication Data
US 2024/0081056 A1     Mar. 7, 2024

(30) Foreign Application Priority Data
Sep. 6, 2022     (TW) .................................. 111133712

(51) Int. Cl.
H10B 41/42          (2023.01)
H10B 41/35          (2023.01)
(Continued)

(52) U.S. Cl.
CPC ............. H10B 41/42 (2023.02); H10B 41/35 (2023.02); H10B 41/41 (2023.02); H10B 43/35 (2023.02); H10B 43/40 (2023.02)

(58) Field of Classification Search
CPC ........ H10B 41/42; H10B 53/00; H10B 53/10; H10B 53/20; H10B 53/30; H10B 53/40;
(Continued)

(56) References Cited

U.S. PATENT DOCUMENTS

2006/0023558 A1*   2/2006   Cho ........................ H10B 69/00
                                                          257/E21.429
2008/0013377 A1*   1/2008   Sel ...................... G11C 16/3427
                                                          365/185.17

(Continued)

*Primary Examiner* — William B Partridge
*Assistant Examiner* — Gustavo G Ramallo
(74) *Attorney, Agent, or Firm* — Winston Hsu

(57)          ABSTRACT

A double patterning method of manufacturing select gates and word lines is provided in the present invention, including forming first string patterns composed of word line patterns and select gate patterns on a target layer, forming a conformal spacer layer on first string patterns, wherein the spacer layer forms trenches between first string patterns, forming a fill layer filling up the trenches on the spacer layer, removing fill layer outside of the trenches, so that fill layer in the trenches forms second string patterns, wherein the second string patterns and the first string patterns are spaced apart, removing exposed spacer layer, so that the first string patterns and the second string patterns constitute target patterns spaced apart from each other on the target layer, and performing an etching process using those target patterns as a mask to remove exposed target layer, so as to form word lines and select gates.

12 Claims, 9 Drawing Sheets

(51) Int. Cl.
  *H10B 41/41*      (2023.01)
  *H10B 43/35*      (2023.01)
  *H10B 43/40*      (2023.01)

(58) Field of Classification Search
  CPC ........ H10B 53/50; H10B 41/00; H10B 41/10;
        H10B 41/20; H10B 41/23; H10B 41/27;
          H10B 41/30; H10B 41/35; H10B
      41/40–44; H10B 41/46–50; H10B 41/60;
        H10B 41/70; H10B 43/00; H10B 43/10;
        H10B 43/20; H10B 43/23; H10B 43/27;
        H10B 43/30; H10B 43/35; H10B 43/40;
        H10B 43/50; H10B 51/00; H10B 51/10;
        H10B 51/20; H10B 51/30; H10B 51/40;
          H10B 51/50; H01L 21/00–0338
  See application file for complete search history.

(56)                References Cited

U.S. PATENT DOCUMENTS

| 2013/0256827 | A1  | 10/2013 | Fischer | |
| 2013/0260557 | A1* | 10/2013 | Wang ................ | H01L 21/32139 |
|              |     |         |         | 438/669 |
| 2013/0264622 | A1* | 10/2013 | Lin ...................... | H10D 30/021 |
|              |     |         |         | 257/314 |
| 2021/0351036 | A1  | 11/2021 | Wang | |

* cited by examiner

DOUBLE PATTERNING METHOD OF MANUFACTURING SELECT GATES AND WORD LINES

BACKGROUND OF THE INVENTION

1. Field of the Invention

The present invention generally relates to a double patterning method for manufacturing select gates and word lines, and more specifically, to a negative double patterning method for manufacturing select gates and word lines.

2. Description of the Prior Art

The principle of a photolithography process is to transfer circuit patterns on a photomask to a wafer by steps of exposure and development, thereby producing specific circuit patterns on the wafer. However, with the trend of miniaturizing and scaling down semiconductor devices, conventional photolithography technology faces serious technical obstacles. Takes mainstream ArF excimer laser method with wavelength of 193 nm for example, the reachable minimum half-pitch of a transistor device produced by this kind of light source during exposure in the photolithography process is 65 nm. By further incorporating the well-known immersion lithography technology, the reachable half-pitch may be further reduced to 45 nm, which is almost the physical limitation in the photolithography processes. For this reason, if the half-pitch of semiconductor device needs to meet the requirement that half-pitch is smaller than 45 nm, the industry needs to utilize more advanced a photolithography technology, such as double patterning technology, extreme ultra violet (EUV) technology, maskless photolithography (ML2) technology or nano-imprint technology, etc.

Different from litho-etch-litho-etch method, self-aligned double patterning (SADP) is currently one of most mature method in the aforementioned various advanced photolithography technologies, which enables the use of current available photolithography tools to produce desired finer circuit patterns, without the requirement to purchase extremely expensive advanced photolithography tools and avoiding huge investments. As the double patterning technology and relevant equipment become gradually mature in the industry, the 193 nm immersion lithography technology once limited by the physical limits can be further applied to the advanced process nodes of 32 nm, or even 22 nm, thereby becoming the mainstream photolithography technology for the next semiconductor generation.

The principle of double patterning technology is to separate one single, dense semiconductor circuit pattern into two alternative or complementary circuit patterns. The two separate patterns will be transferred respectively by the photolithography process like immersion lithography and then be combined on the wafer to obtain the final completed circuit pattern, which may lower the requirement of overlay accuracy of first photomask and second photomask. Through the application of this technology in current NAND flash memory, word line or bit line structures in memory bock with spacing smaller than 28 nm may be manufactured, thereby effectively increasing the unit area storage capacity of the memory.

With regard to the manufacture of data-storage flash memory using current conventional SADP technology, positive SADP is usually used, especially for the manufacture of word lines and select gates in string regions, wherein a spacer layer in the double patterns is used to define string patterns, and mandrel layers and openings in the double patterns are used to define spacings between the string patterns. This approach doesn't encounter any problems in the process node with critical dimension (CD) over 20 nm. However, the disadvantages of using positive SADP method to manufacture string patterns are gradually exposed in the trend that current semiconductor layouts are developed with smaller pattern CD and high density, including that the width of select gate can only be specific size, the spacing between select gate and adjacent word line can't be adjusted, the window for overlay shift is insufficient, and edge pattern defects caused by micro loading effect, etc.

Accordingly, in response to the trend that critical dimension becomes smaller and pattern density gets higher in current semiconductor layout, it is necessary for those of skilled in the art to develop and improve current conventional double patterning technology in the semiconductor industry, in order to overcome the aforementioned conventional issues.

SUMMARY OF THE INVENTION

In the light of the aforementioned disadvantages of current self-aligned double patterning (SADP) method for manufacturing data-storage flash memory, the present invention hereby provides a novel SADP method, featuring the use of negative SADP scheme to manufacture structures like word lines and select gates in string regions, which can effectively solve the aforementioned issues that may be encountered in positive SADP scheme.

The objective of present invention is to provide a double patterning method of manufacturing select gates and word lines, including steps of providing a substrate with a target layer formed thereon, forming first string patterns on the target layer, wherein the first string patterns extend in a first direction and are spaced apart in a second direction perpendicular to the first direction, and the first string patterns includes word line patterns with smaller width in the second direction and select gate patterns with larger width in the second direction, forming a conformal spacer layer on the first string patterns and the substrate, wherein the spacer layer forms trenches between parts of the first string patterns, and these trenches extend in the first direction and are spaced apart in the second direction, forming a fill layer fills up the trenches on the spacer layer, removing the fill layer outside of the trenches, so that the fill layer remaining in the trenches forms second string patterns, and these second string patterns extend in the first direction and are spaced apart from the first string patterns in the second direction, performing a first etching process to anisotropically remove the exposed spacer layer, so that the first string patterns and the second string patterns constitute target patterns spaced apart from each other on the target layer, and performing a second etching process using the target patterns as an etching mask to anisotropically remove the exposed target layer so as to form word lines and select gates.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figures 1A, 1B:
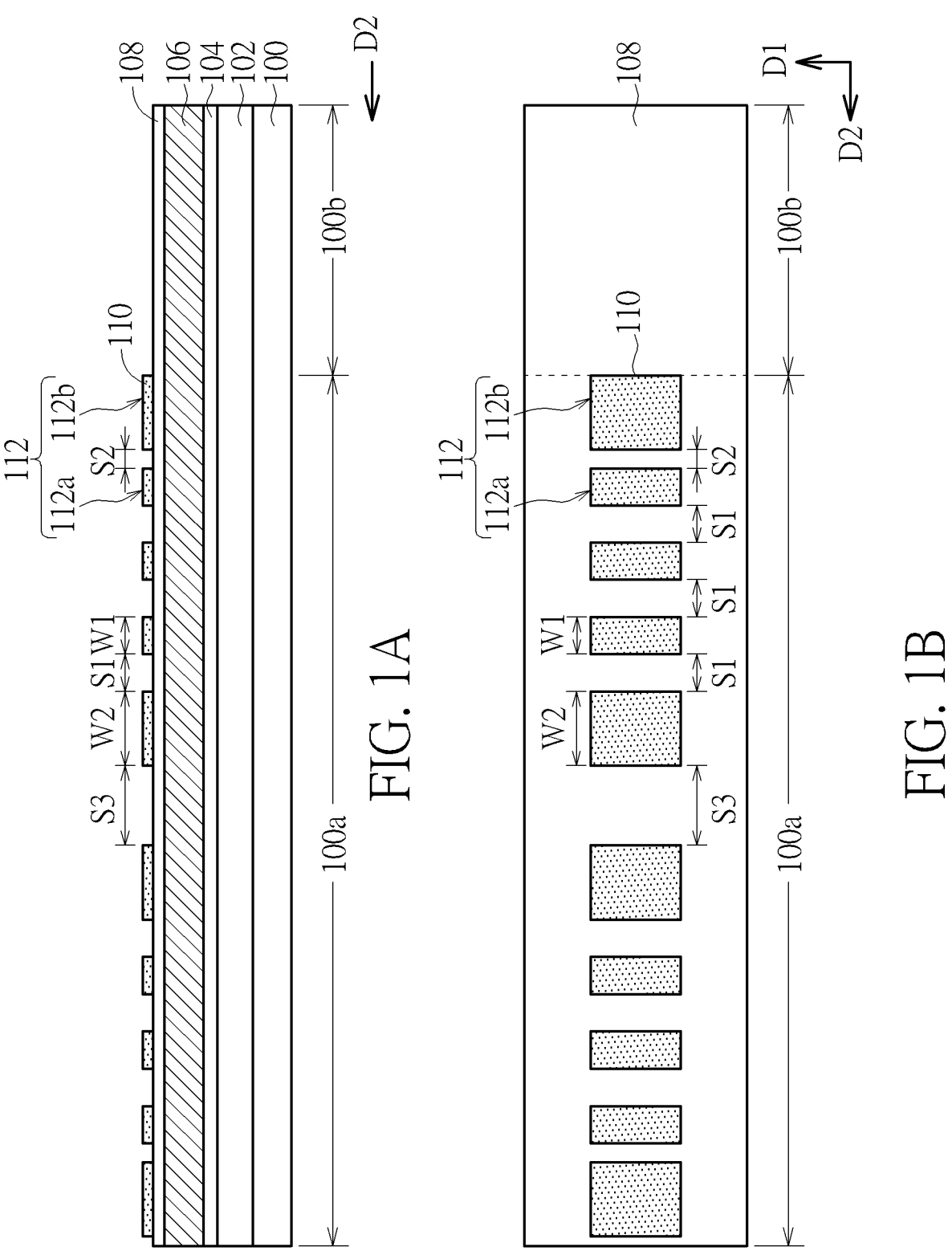
FIG. 1A, FIG. 2A, FIG. 3A, FIG. 4A, FIG. 5A, FIG. 6A, FIG. 7A, FIG. 8A and FIG. 9A are schematic cross-sectional views illustrating the process flow of double patterning method for manufacturing select gates and word lines in accordance with the preferred embodiment of present invention.
FIG. 1B, FIG. 2B, FIG. 3B, FIG. 4B, FIG. 5B, FIG. 6B, FIG. 7B, FIG. 8B and FIG. 9B are schematic top views illustrating the process flow of double patterning method for manufacturing select gates and word lines in accordance with the preferred embodiment of present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something). Further, spatially relative terms, such as "beneath," "below," "lower," "above," "upper," and the like, may be used herein for ease of description to describe one element or feature relationship to another element (s) or feature (s) as illustrated in the figures.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon (Si), germanium (Ge), gallium arsenide (GaAs), indium phosphide (InP), etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. Additionally, the term "based on" may be understood as not necessarily intended to convey an exclusive set of factors, but may allow for the presence of other factors not necessarily expressly described, again depending at least in part on the context.

It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The method of present invention will now be described in following embodiment with reference to drawings, wherein FIG. 1A to FIG. 9A are schematic cross-sectional views illustrating the process flow of double patterning method for manufacturing select gates and word lines in accordance with the preferred embodiment of present invention. The double patterning method provided by the present invention is a kind of negative self-aligned double patterning (SADP) method, wherein string patterns are defined by the mandrels and openings in the double pattern and spacings between the string patterns are defined by the spacer layers in the double pattern.

First, at the beginning of process, as shown in FIG. 1A and FIG. 1B, a substrate 100 is provided as a base for setting the semiconductor devices in the structure of present invention. The material of substrate 100 may include silicon substrate, silicon-containing substrate, Group III-V-on-silicon (ex. GaN-on-silicon), graphene-on-silicon or silicon-on-insulator (SOI) substrate and so on, but not limited thereto. In the embodiment of present invention, a memory cell region 100a and a peripheral region 100b are defined on the substrate 100. Memory structures like memory cell, word line, bit line, select gate and storage node will be formed on the memory cell region 100a, and peripheral circuits will be formed on the peripheral region 100b, including circuit components like word line driver, address selector, buffer, gate voltage controller and/or current sense amplifier.

Refer still to FIG. 1A. In the preferred embodiment of present invention, a target layer 102, a first hard mask layer 104, a mandrel layer 106 and a second hard mask layer 108 are formed sequentially on the substrate 100, wherein target layer 102 is configured to be patterned in later processes in order to form components or conductive lines of various semiconductor devices. In the embodiment of present invention, the target layer 102 is used to form conductive lines, like word lines and select gates in the circuit layout of NAND flash memory, with materials including polysilicon, amorphous silicon, metal silicide, metal and so on. The first hard mask layer 104 serves as a mask used in the process of patterning the target layer 102, with material like silicon oxide. The mandrel layer 106 will be patterned into first patterns in the double patterns in later processes, with material like silicon nitride, silicon oxide, polysilicon, amorphous silicon, amorphous carbon, etc., but not limited thereto. However, the mandrel layer 106 and the underlying first hard mask layer 104 should have different etch selectivities. That is, with respect to an etching process, the mandrel layer 106 and the first hard mask layer 104 will have significantly different etch rates, to facilitate the patterning of first hard mask layer 104 and target layer 102 using the mandrel layer 106 as an etching mask in later processes. The second hard mask 108 serves as a mask used in the process of patterning the mandrel layer 106, and it may also serve as an etch stop layer, with material like spin-on dielectrics (spin-on hard mask like methylsilsesqui-oxane, MSQ). Please note that the aforementioned layer structure is merely a basis embodiment of present invention. In other embodiment, more layer structures may be provided on the substrate 100 or included in the substrate 100 without departing from the method concept of the present invention. In addition, in other embodiment, the first hard mask layer 104 and the second hard mask layer 108 may be omitted to directly pattern the mandrel layer 106 and/or the target layer 102.

Please refer to FIG. 1A and FIG. 1B. After the substrate 100 and the layer structures above are prepared, a patterned first photoresist 110 is then formed on the second hard mask layer 108 through a photolithography process. In the preferred embodiment of present invention, the first photoresist 110 defines the first string patterns 112 in the double patterns, including word line patterns 112a with smaller width W1 in a second direction D2 and select gate patterns 112b with larger width W2 in the second direction D2 (for example, three to five times of the width of the word line patterns). As shown in FIG. 1B, the first string patterns 112 extend in a first direction D1 and are spaced apart in the second direction D2 perpendicular to the first direction D1. These patterns will be transferred to underlying mandrel layer 106 as the first patterns in the double pattern. The photoresist patterns will not be formed on the peripheral region 100b of the substrate 100 since no memory string is configured to be formed thereon. Please note that there are multiple sets of string pattern in the embodiment of present invention. A set of string pattern may include three word line patterns 112a and two select gate patterns 112b at two outermost sides in the second direction D2. Although there are only two string sets provided in the figures as an example, a set of string pattern may include 32, 64 or even more word line patterns, and there may be more than two sets of string pattern in actual implementation. Generally, the first string patterns 112 are spaced apart by equal spacing, ex. regular spacings S1 in the figure. However, different spacings may also be provided in the present invention, like the spacing S2 in the figure, or the spacing S3 between adjacent select patterns 112b of different string sets.

Figures 2A, 2B:
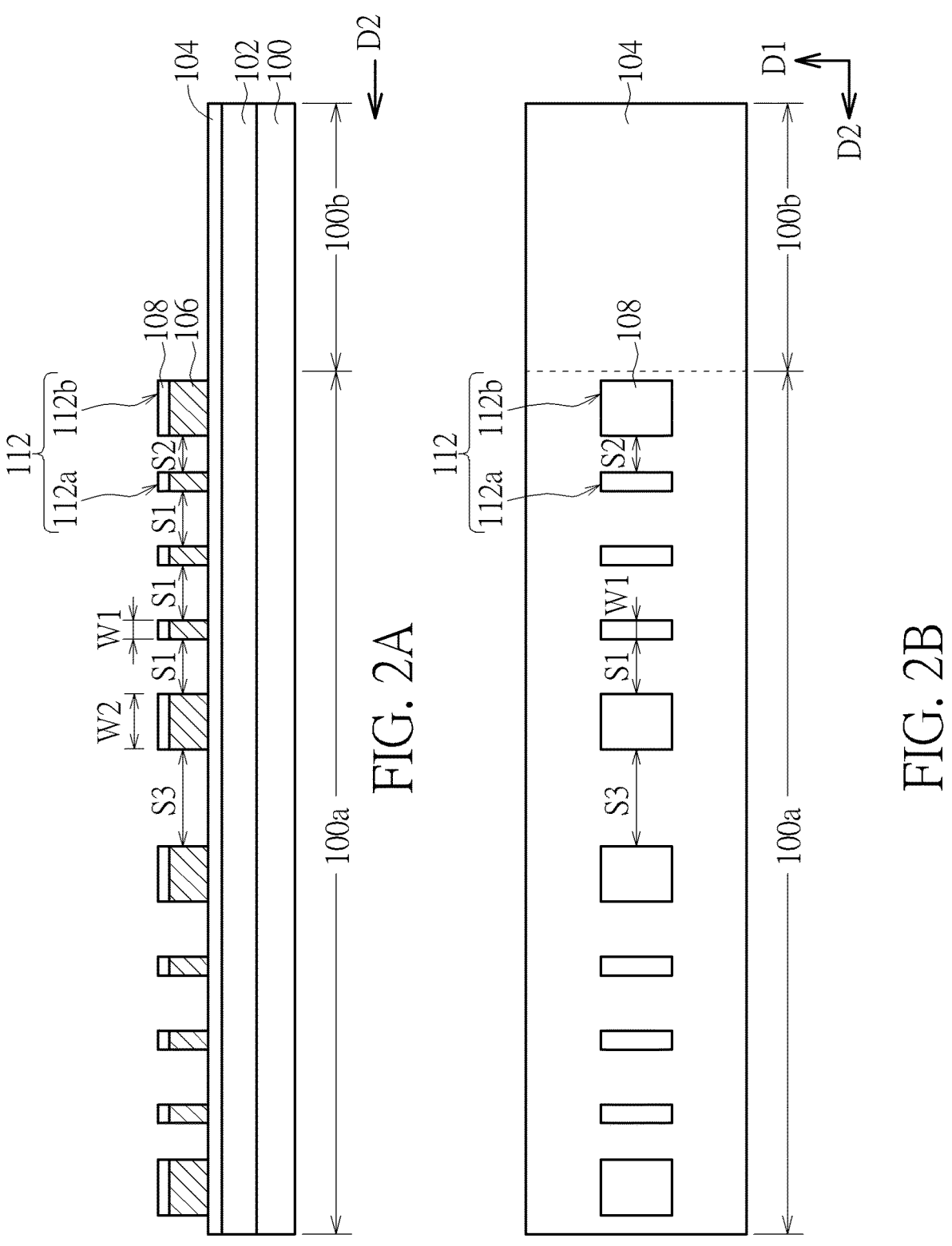

Please refer to FIG. 2A and FIG. 2B. After the patterned first photoresist 110 is formed, an etching process is performed using the first photoresist 110 as an etching mask to remove exposed second hard mask layer 108 and the mandrel layer 106 therebelow, so that the first string patterns 112 are transferred to the second hard mask layer 108 and the mandrel layer 106. More specifically, this etching process may include steps of removing the second hard mask layer 108 first, then removing the first photoresist 110, and then removing the exposed mandrel layer 106 using the patterned second hard mask layer 108 as a mask, so as to form the first string patterns 112 composed of word line patterns 112a and select gate patterns 112b in the second hard mask layer 108 and the mandrel layer 106. The first string patterns 112 exposes underlying first hard mask layer 104.

Please note that in the embodiment of present invention, a trimming process is further performed after the first string patterns 112 are formed in the second hard mask layer 108 and mandrel layer 106, to laterally remove parts of the second hard mask layer 108 and mandrel layer 106 and reduce the width of these first string patterns 112 in the second direction D2 to a predetermined critical dimension, in order to manufacture tiny memory cell. The trimming process may be a lateral etching process. It can be seen that the width W1 of word line patterns 112a in the second direction D2 after trimming in FIG. 2B is smaller than the width W1 of word line patterns 112a in the second direction D2 before trimming in FIG. 1B. In the embodiment of present invention, the spacing S1 (regular spacing) of trimmed word line patterns 112a in the second direction D2 is preferably three times of the width W1 of word line patterns 112a. The spacing S2 (irregular spacing) may be smaller than two times of the width W1 of word line patterns 112a. The spacing S3 between adjacent select gate patterns 112b of different string sets may be several times of the width W1 of word line patterns 112a.

Figures 3A, 3B:
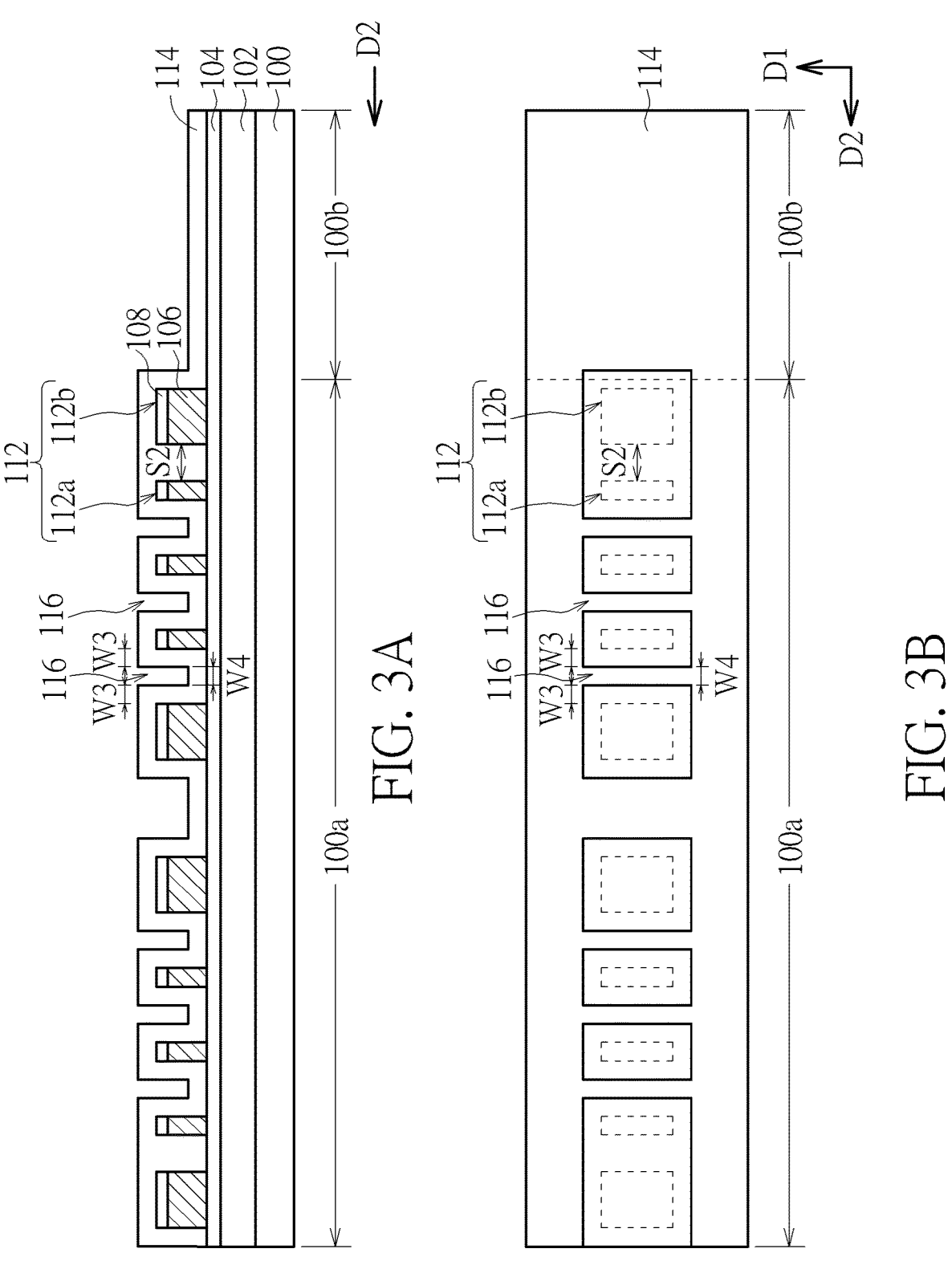

Please refer to FIG. 3A and FIG. 3B. After the second hard mask layer 108 and the mandrel layer 106 are patterned to form the first string patterns 112, a conformal spacer layer 114 is then formed on the first string patterns 112 and first hard mask layer 104. The spacer layer 114 would fully cover entire surface of the substrate, which its material may be silicon oxide formed through atomic layer deposition method that can precisely control thickness. In the embodiment of present invention, the thickness W3 of spacer layer 114 may equal the width W1 of word line patterns 112a in the second direction D2. In this configuration, the spacer layer 114 will form trenches 116 between parts of the first string patterns 112 (in the regular spacing S1, preferably three times of the width W1 of the word line patterns 112a), and its width W4 in the second direction D2 is similarly equal to the width W1 of word line patterns 112a. With respect to spacing S2 (irregular spacing smaller than two times of the width W1 of word line patterns 112a), the conformal spacer layer 114 will merge and fill up the spacing S2. From the view of FIG. 3B, these trenches 116 extend in the first direction D1 and are spaced apart from the first string patterns 112 in the second direction D2, especially the word line patterns 112a in the first string patterns 112.

Figures 4A, 4B:
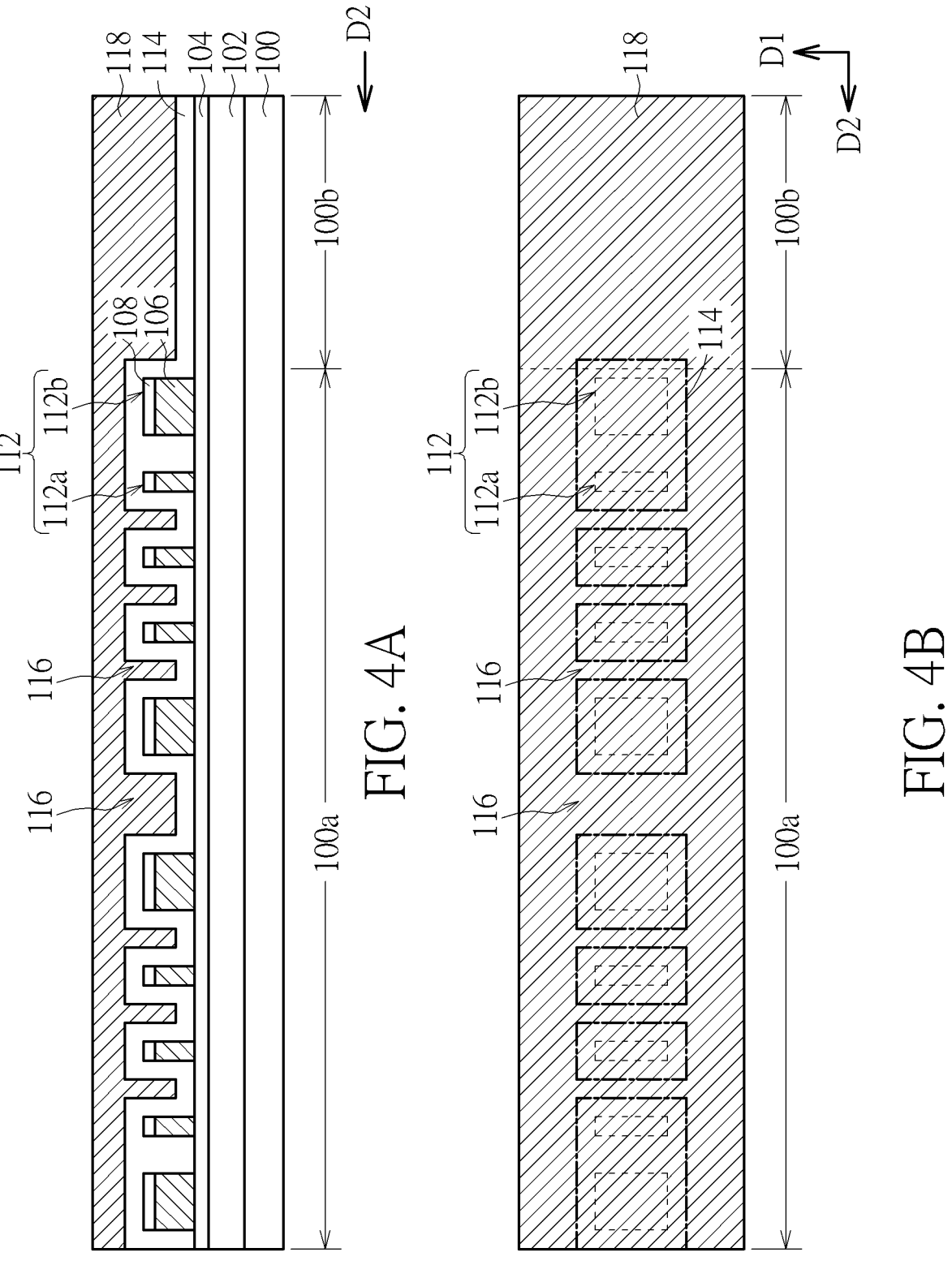

Please refer to FIG. 4A and FIG. 4B. After forming the spacer layer 114, a fill layer 118 is then formed on the spacer layer 114. The fill layer 118 would fully cover entire surface of the substrate, which its material may be organic siloxane film like bottom anti-reflective coating (BARC), or trilayer composed of BARC, low-temperature thermal oxide layer and photoresist layer, which may be formed on the spacer layer 114 and fill up trenches 116 through spin coating or chemical mechanical deposition (CVD) to provide flat surface. The spacer layer 114 formed in this way will be patterned into second string patterns in later processes.

Figures 5A, 5B:
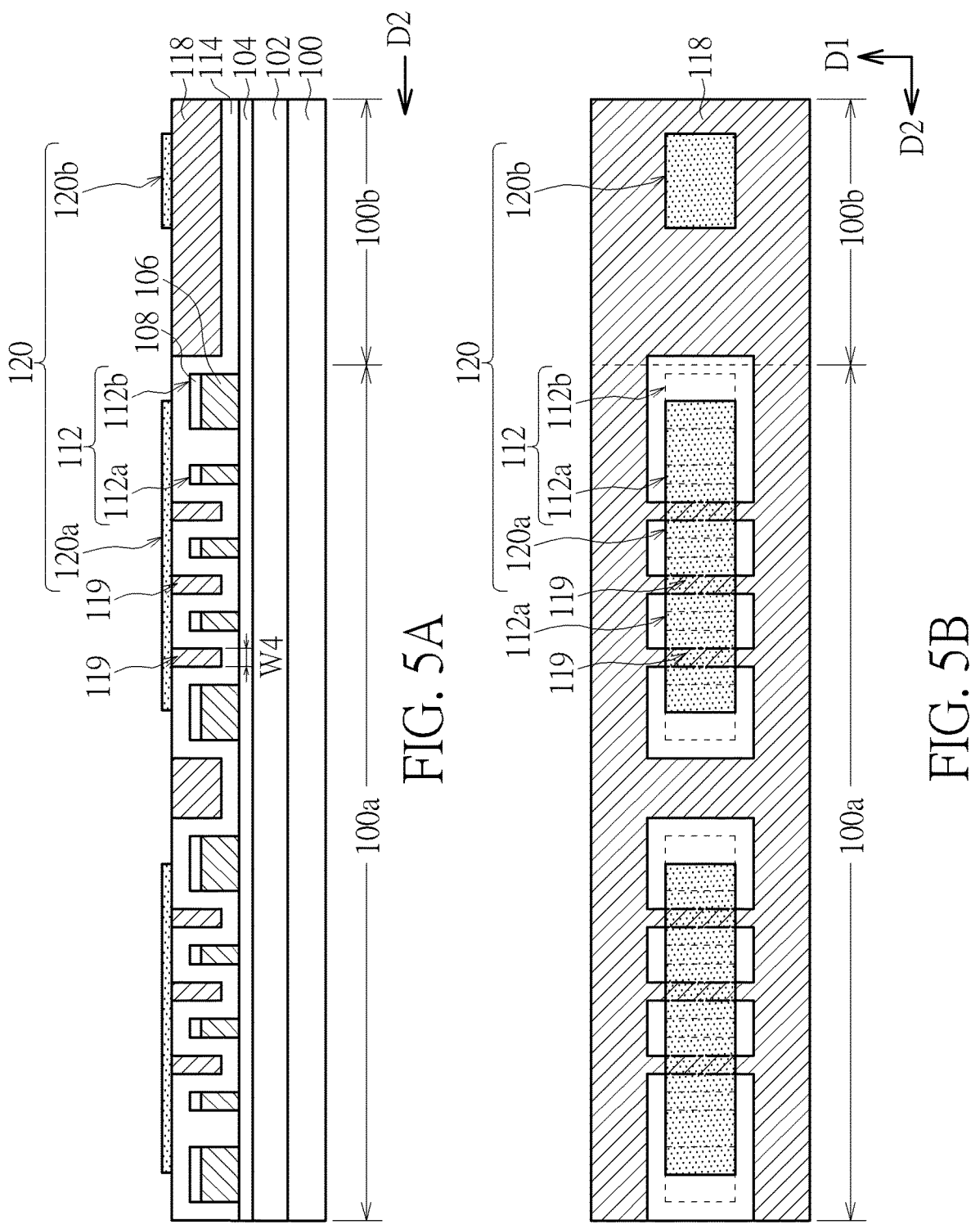

Please refer to FIG. 5A and FIG. 5B. After forming the fill layer 118, an etchback process is then performed to remove the fill layer 118 higher than a level of the top plane of spacer layer 114, so as to expose parts of the spacer layer 114 covered by the fill layer 118, including the spacer layer 114 surrounding and on the first string patterns 112, and the fill layer 118 is also patterned in this step, wherein the patterns between the first string patterns 112 are the second string patterns 119 (second pattern) of the present invention. At this stage, these second string patterns 119 are not separated and have connecting parts connecting each other.

Refer still to FIG. 5A and FIG. 5B. After the etchback process, a patterned second photoresist 120 is then formed. In the embodiment of present invention, the second photoresist 120 serves as an etching mask to pattern the aforementioned fill layer 118 that has been treated by the etchback process, so that the second string patterns 119 are cut and become separated from each other. Furthermore, the second photoresist 120 may also be used to simultaneously define gate patterns in the peripheral region 100b. As shown in the figures, the second photoresist 120 includes a first portion 120a and a second portion 120b, wherein the first portion 120a is on the sets of string patterns, while the second portion 120b is on the peripheral region 100b. More specifically, the first portion 120a on the sets of string patterns is aligned with underlying first string patterns 112 in the first direction D1. The first portion 120a of photoresist would not extend out of the two select gate patterns 112b at two outermost sides of each string set in the second direction D2. In this way, the fill layer 118 covered by the first portion 120a of photoresist is the second string patterns 119 in the present invention, which are spaced apart from the first string patterns 112 in the second direction D2 and are aligned in the first direction D1. The width W5 of second string patterns 119 is equal to the width W4 of original trenches 116, which preferably equal to the width W1 of word line patterns 112a. In another aspect, the second portion 120b of photoresist is on the peripheral region 100b to define gate patterns of peripheral devices.

Figures 6A, 6B:
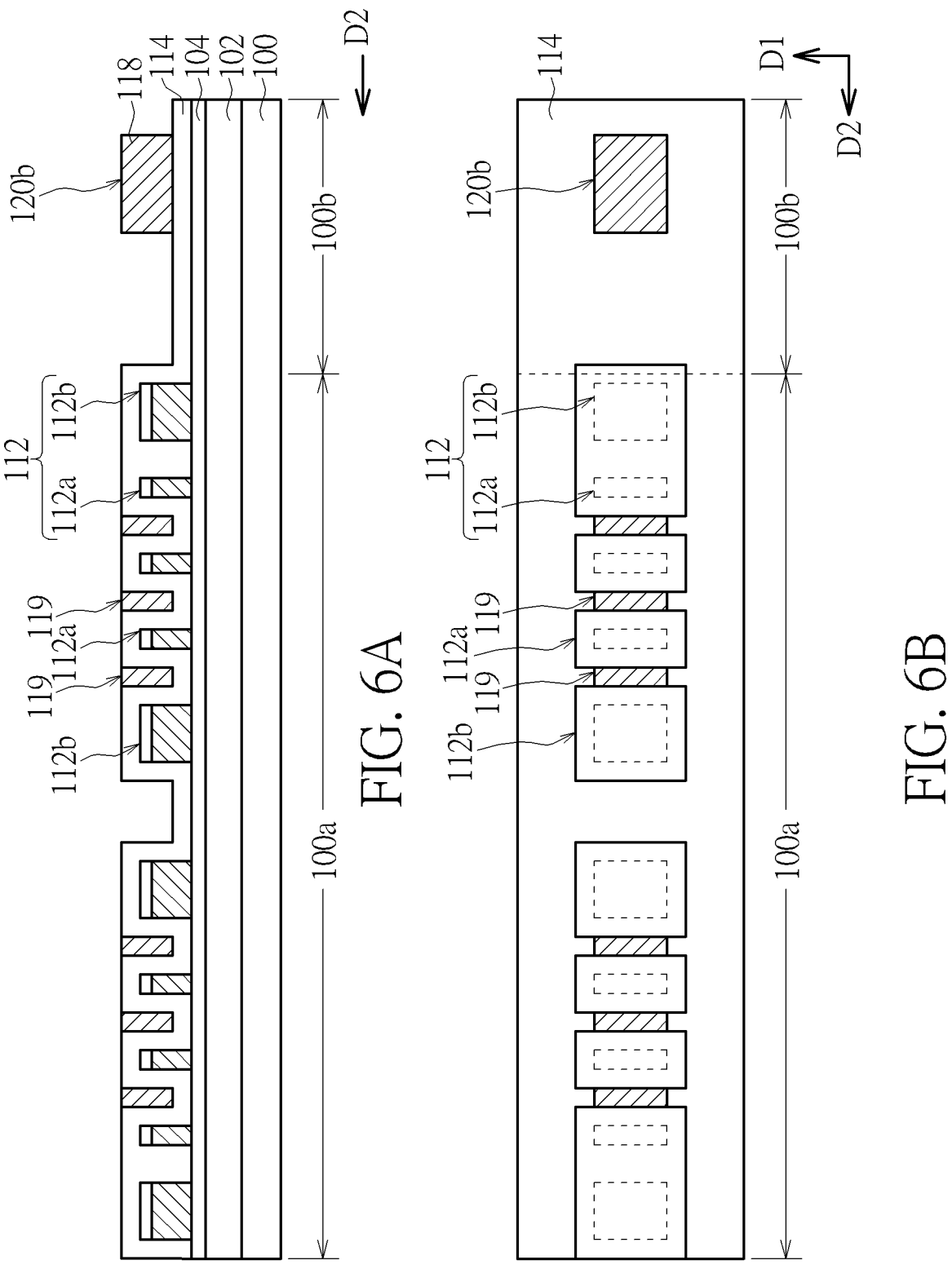

Please refer to FIG. 6A and FIG. 6B. After the second photoresist 120 is formed, an anisotropic etching process is performed using the second photoresist 120 as an etching mask to remove the exposed fill layer 118, so that the fill layer 118 forms the second string patterns 119 on the memory cell region 100a and the gate patterns 120b on the peripheral region 100b. The second string patterns 119 and the first string patterns 112 are spaced apart in the second direction D2 and preferably align in the first direction D1. More specifically, the second string patterns 119 and the word line patterns 112a in the first string patterns 112 collectively constitute the word line patterns to be defined in the present invention. Each set of word line pattern is provided with two select gate patterns 112b of the first string patterns 112 at two outermost sides in the second direction D2.

Figures 7A, 7B:
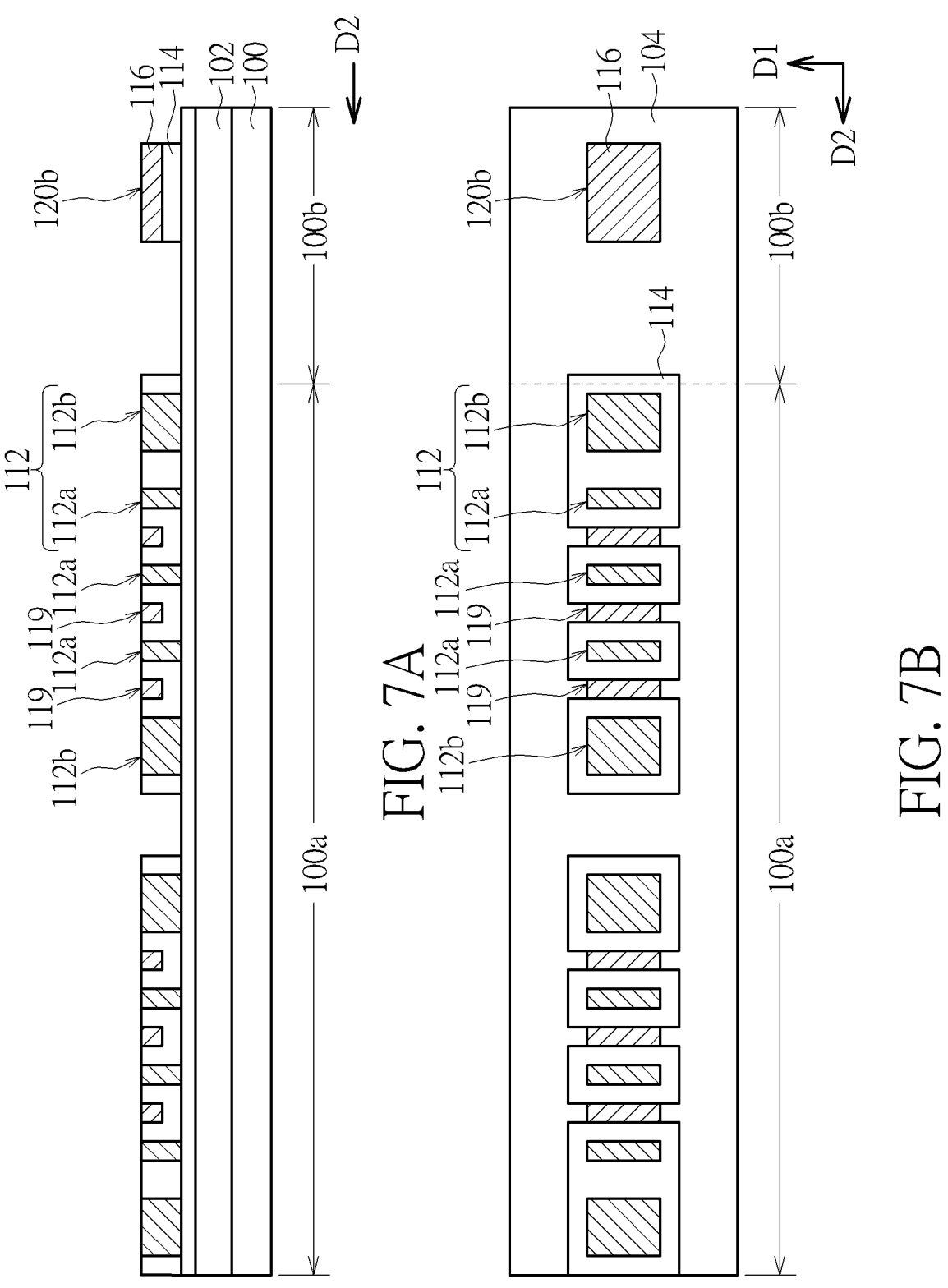

Please refer to FIG. 7A and FIG. 7B. After the second string patterns 119 are formed, another etchback process is then performed to remove the spacer layer 114 higher a level of top plane of the mandrel layer 106, so as to expose the mandrel layer 106 (i.e. first string patterns 112) and the first hard mask layer 104 on the substrate surface. Please note that this etchback process would remove parts of the spacer layer 114 between adjacent select gate patterns 112b and the exposed spacer layer 114 on the peripheral region 100b. In this way, from the view of FIG. 7B, the spacer layer 114 only has the part surrounding the first string patterns 112 left on the substrate. This etchback process would also remove the fill layer 118 and the second hard mask layer 108 higher than a level of top plane of the mandrel layer 106, so that the top planes of first string patterns 112, second string patterns 119 and surrounding spacer layer 114 are flush to facilitate later processes.

Figures 8A, 8B:
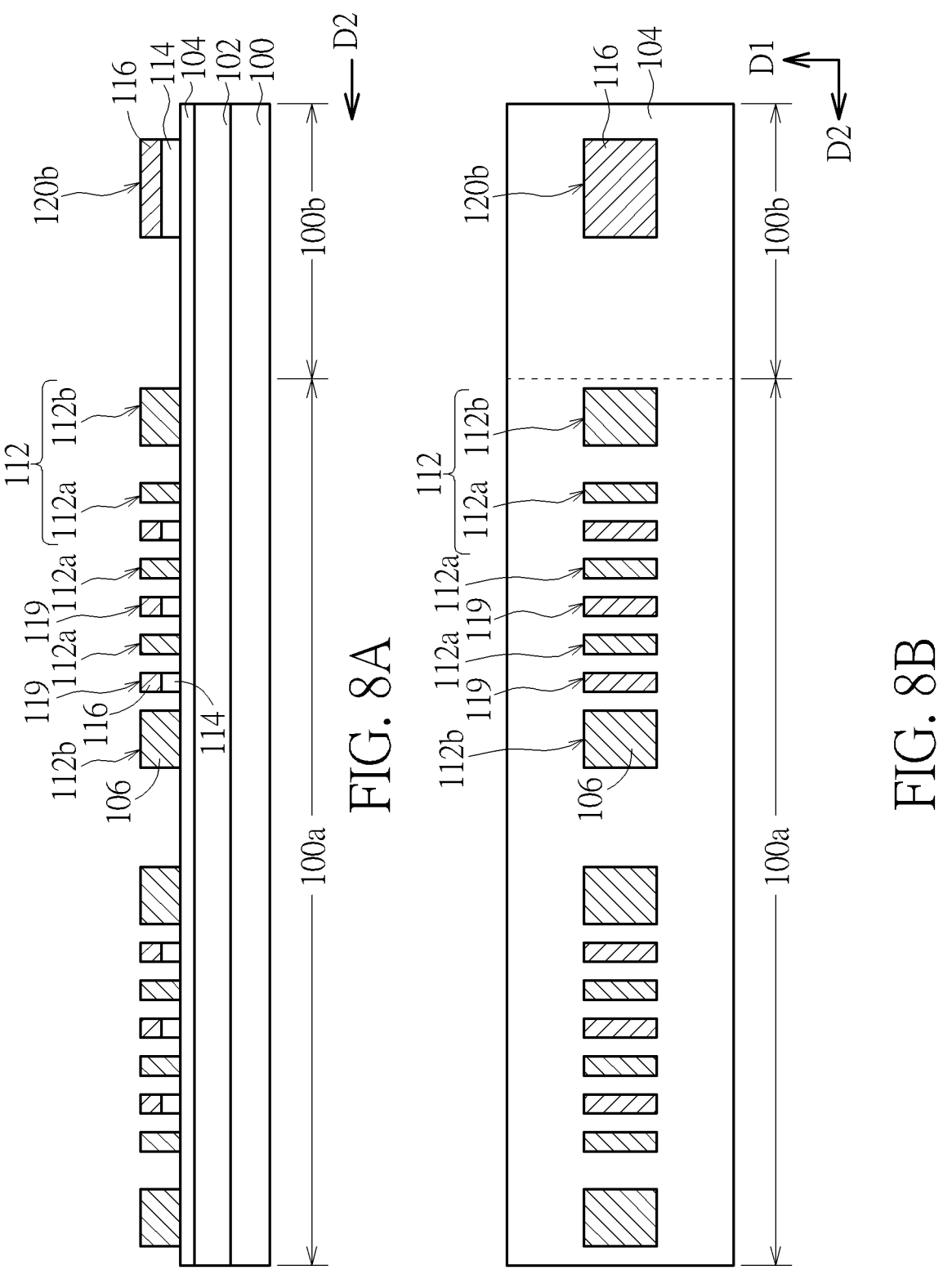

Please refer to FIG. 8A and FIG. 8B. After the mandrel layer 106 is exposed, an anisotropic etching process is performed to remove the exposed spacer layer 114, so as to form the first string patterns 112, second string patterns 119 and gate patterns 120b on the first hard mask layer 104, wherein the first string patterns 112 are composed completely of the mandrel layer 106, while the second string patterns 119 are composed of lower spacer layer 114 and upper fill layer 118. The first string patterns 112 and the second string patterns 119 collectively constitute the target patterns of present invention, including word line patterns and select gate patterns, which are spaced apart in the second direction D2 and are aligned in the first direction D1. In addition, gate patterns 120b are also formed simultaneously on the peripheral region 100b.

Figures 9A, 9B:
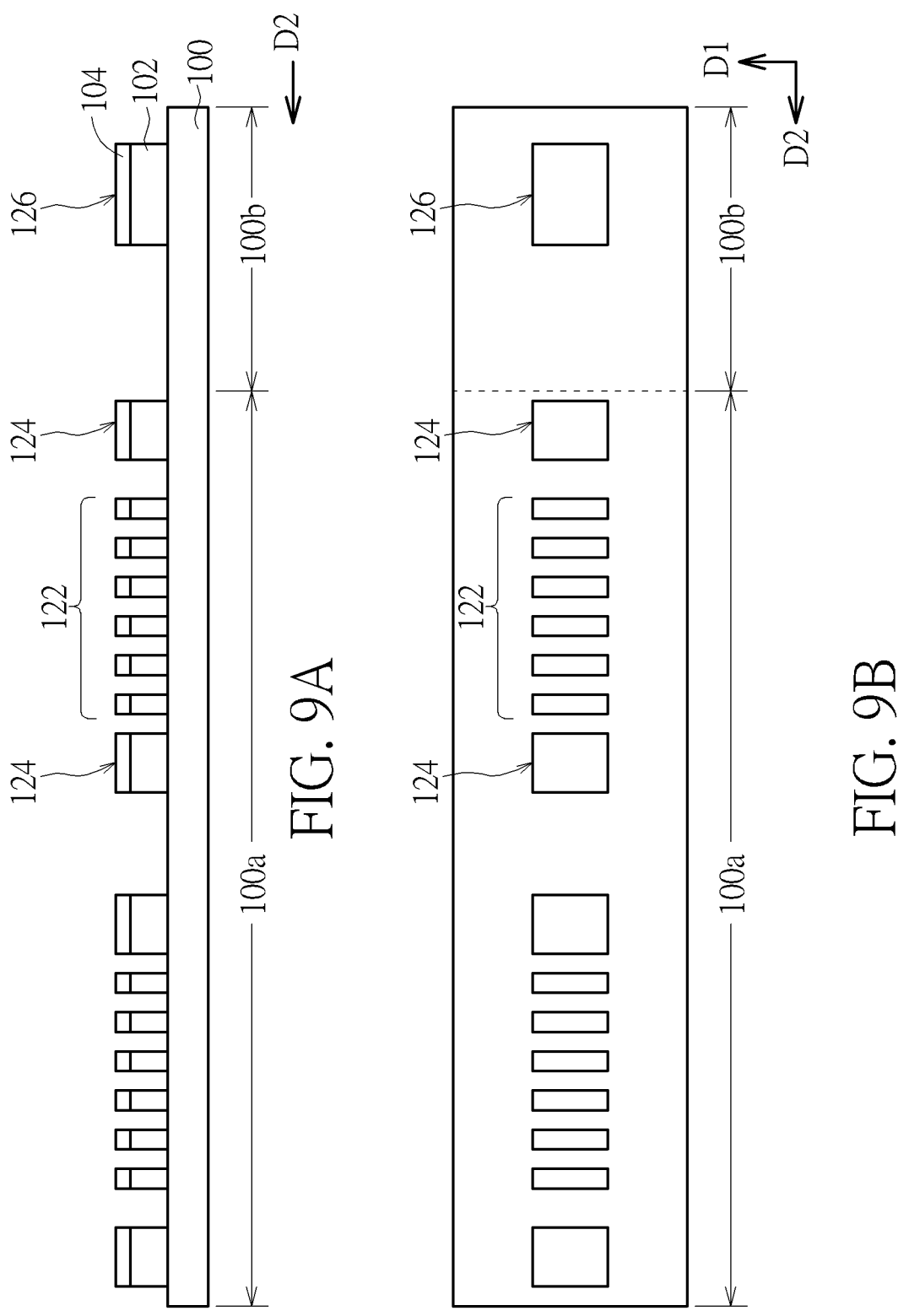

Please refer to FIG. 9A and FIG. 9B. After the spacer layer 114 is removed, an anisotropic etching process is then performed using the first string patterns 112, second string patterns 119 and gate patterns 120b as an etching mask to remove the exposed first hard mask layer 104 and the target layer 102 therebelow, so that the patterns are transferred to first hard mask layer 104 and target layer 102. More specifically, this etching process may include first removing the exposed first hard mask layer 104, and then removing the exposed target layer 102 using the patterned first hard mask layer 104 as an etching mask, so as to form word lines 122 and select gates 124 on the memory cell region 100a and the gates 126 in the peripheral region 100b in the present invention.

According to the approaches of embodiments above, the advantage of utilizing negative SADP method for manufacturing word lines and select gates in NAND flash memory in present invention may include:

1. In conventional positive SADP, since line patterns are defined by a spacer layer (corresponding to the spacer layer 114 of present invention), the select gate 124 having a width of several time of critical dimension is usually defined by blocking several spacer layers and the trenches thereon (corresponding to the trenches 116 in FIG. 3A of present invention) with photoresist. Accordingly, the width of select gate in the second direction D2 manufactured through conventional positive SADP method must be exactly the odd number of times of the width of word lines (i.e. thickness of the spacer layer). In comparison thereto, since the present invention utilizes negative SADP method, the width of select gate in the second direction D2 is defined by the select gate patterns 112b in the first photoresist 110 at beginning of the process, thus it may not be limited to odd number of times of the width of word lines, which may render the design of select gate more flexible.

2. Follow the description above, since using conventional positive SADP method for defining select gates may require photoresists to block on the spacer layer, the window of overlay shift between the first string patterns formed by these photoresist and first string patterns is merely plus or minus half F or one F (i.e. critical dimension), so that the overlay shift may easily cause misalignment and the width and pattern of select gates manufactured in this way may be too large or non-uniform. Since the select gates in present invention are defined directly through the first photoresist 110, the aforementioned steps are unnecessary, so that conventional problems would not happen. Furthermore, as shown in FIG. 5A, the first portion 120*a* of second photoresist 120 in the present invention extend in the second direction D2 on two select gate patterns 112*b* at two outermost sides of each set of string patterns, thus the window of overlay shift may be larger than 2F in this process, and the select gates manufactured in the process would not suffer oversized or non-uniform issues.

3. In conventional positive SADP method, edge word line patterns (formed of the spacer layer) adjacent to the select gates at two sides may be easily damaged or collapse, so that the word lines manufactured through this pattern may suffer pattern defect issue. In comparison thereto, the edge word line patterns of present invention are defined by the mandrel layer 106 or by the fill layer 118 formed in later processes, and the heights of masks of the edge word line patterns and adjacent select gate patterns are the same in every etching process as shown in FIG. 2A and FIG. 7A, so that edge word lines would not be easily impacted by micro-loading effect and the defect issue can be prevented.

4. Lastly, in actual implementation, since high electric field and tiny critical dimension may easily cause issues like dielectric breakdown or leakage between word line and select gate, it is hoped that the spacing between select gate and edge word line is flexible and adjustable in the design. With regard to this purpose, the spacing between select gate and edge word line pattern in conventional positive SADP method must be exactly one time of the width (1F) of word line and can't be adjusted flexibly. In comparison thereto, the spacing S2 between select gate and edge word line pattern formed by the negative SADP method of present invention will not be limited. As shown in FIG. 2A, when the spacing S1 between the select gate pattern 112*b* and edge word line pattern 112*a* in the first string patterns 112 is three times of the width of word line (3F), the final spacing between the select gate and the word line would be common one time of the width of word line (1F, regular spacing). When the spacing S2 between the select gate pattern 112*b* and edge word line pattern 112*a* in the first string patterns 112 is smaller than two times of the width of word line (<2F), the final spacing between the select gate and the word line would be original spacing S2 (irregular spacing), with a flexible, adjustable value in the range of 1F to 2F.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A double patterning method of manufacturing select gates and word lines, comprising:

providing a substrate with a target layer formed thereon;

forming first string patterns on said target layer, wherein said first string patterns extend in a first direction and are spaced apart in a second direction perpendicular to said first direction, and said first string patterns comprises word line patterns with smaller width in said second direction and select gate patterns with larger width in said second direction;

forming a conformal spacer layer on said first string patterns and said substrate, wherein said conformal spacer layer forms trenches between parts of said first string patterns, and said trenches extend in said first direction and are spaced apart from said first string patterns in said second direction;

forming a fill layer on said conformal spacer layer, and said fill layer fills up said trenches;

removing said fill layer outside of said trenches, so that said fill layer remaining in said trenches forms second string patterns, and said second string patterns extend in said first direction and are spaced apart from said first string patterns in said second direction;

performing an etchback process to remove said conformal spacer layer and said second string patterns above a level of top planes of said first string patterns after removing said fill layer outside of said trenches, so that said first string patterns are exposed and said top planes of said first string patterns, said second string patterns and said conformal spacer layer are flush;

performing a first etching process to anisotropically remove exposed said conformal spacer layer after said etchback process, so that said first string patterns and said second string patterns constitute target patterns spaced apart from each other on said target layer; and performing a second etching process using said target patterns as an etching mask to anisotropically remove exposed said target layer, so as to form word lines and select gates.

2. The double patterning method of manufacturing select gates and word lines of claim 1, wherein steps of forming said first string patterns on said target layer comprises:

forming a mandrel layer on said target layer;

forming a first photoresist on said mandrel layer, and said first photoresist defines said word line patterns and said select gate patterns; and performing a third etching process using said first photoresist as an etching mask to transfer said word line patterns and said select gate patterns to said mandrel layer.

3. The double patterning method of manufacturing select gates and word lines of claim 1, further comprising performing a trimming process to reduce a width of said first string patterns in said second direction after forming said first string patterns and before forming said conformal spacer layer.

4. The double patterning method of manufacturing select gates and word lines of claim 1, wherein a hard mask layer are provided on said first string patterns, and said etchback process is performed until said hard mask layer is removed.

5. The double patterning method of manufacturing select gates and word lines of claim 1, further comprising performing following steps after removing said fill layer outside of said trenches and before said first etching process:

forming a second photoresist on said conformal spacer layer and said second string patterns, and said second photoresist aligns with said first string patterns below in said first direction and doesn't extends beyond two said select gate patterns at outermost sides of said first string patterns in said second direction; and performing a third etching process using said second photoresist as an etching mask to remove exposed said fill layer, so that said fill layer remaining in said trenches forms said second string patterns.

6. The double patterning method of manufacturing select gates and word lines of claim 5, wherein said second photoresist simultaneously defines gate patterns on a peripheral region, and said third etching process simultaneously forms said gate patterns in said fill layer on said peripheral region.

7. The double patterning method of manufacturing select gates and word lines of claim 5, wherein said second photoresist further exposes connecting parts of said second string patterns that extend beyond said first string patterns in said first direction, and said third etching process removes said connecting parts so as to form separated said second string patterns, wherein said separated second string patterns and parts of said first string patterns are alternately arranged to form said word line patterns.

8. The double patterning method of manufacturing select gates and word lines of claim 1, wherein a width of said word line patterns in said second direction is first width, and a spacing of said word line patterns in said first string patterns in said second direction is three time of said first width, and a thickness of said conformal spacer layer is said first width, and a width of said trenches in said second direction is said first width.

9. The double patterning method of manufacturing select gates and word lines of claim 1, wherein a width of said word line patterns in said second direction is first width, and a width of said select patterns in said second direction is three times to five times of said first width, and a spacing of parts of said select gate patterns and adjacent word line patterns in said second direction is said first width, and a spacing of parts of said select gate patterns and adjacent word line patterns in said second direction is larger than said first width and smaller than two times of said first width.

10. The double patterning method of manufacturing select gates and word lines of claim 9, wherein said conformal spacer layer is merged together rather than forms said trenches in said spacing larger than said first width and smaller than twice of said first width between said select gate patterns and adjacent said word line patterns.

11. The double patterning method of manufacturing select gates and word lines of claim 1, wherein a width of said word line patterns in said second direction is first width, and a width of said select gate patterns in said second direction is not odd number of times of said first width.

12. The double patterning method of manufacturing select gates and word lines of claim 1, further comprising a hard mask layer between said target layer and said target patterns, and said second etching process first transfers said target patterns to said hard mask layer, and then anisotropically removes exposed said target layer using said hard mask as an etching mask, so as to form word lines and select gates.

* * * * *